(12) United States Patent
Otera

(10) Patent No.: US 9,390,876 B2
(45) Date of Patent: Jul. 12, 2016

(54) LAMINATE-TYPE ACTUATOR

(71) Applicant: MURATA MANUFACTURING CO., LTD., Kyoto (JP)

(72) Inventor: Shozo Otera, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 128 days.

(21) Appl. No.: 14/295,453

(22) Filed: Jun. 4, 2014

(65) Prior Publication Data

US 2014/0284189 A1  Sep. 25, 2014

Related U.S. Application Data

(63) Continuation of application No. PCT/JP2012/078924, filed on Nov. 8, 2012.

(30) Foreign Application Priority Data

Dec. 13, 2011 (JP) ................. 2011-272005

(51) Int. Cl.
*H01L 41/08* (2006.01)
*H01H 57/00* (2006.01)
*H01L 41/09* (2006.01)
(Continued)

(52) U.S. Cl.
CPC ............ *H01H 57/00* (2013.01); *H01L 41/0836* (2013.01); *H01L 41/0986* (2013.01); *H01L 41/27* (2013.01); *H01L 41/33* (2013.01); *H01L 41/193* (2013.01)

(58) Field of Classification Search
CPC .............. H01L 41/083; H01L 41/0836; H01L 41/0838
USPC ......................................................... 310/328
See application file for complete search history.

(56) References Cited

U.S. PATENT DOCUMENTS

| | | | |
|---|---|---|---|
| 6,262,516 B1 | 7/2001 | Fukuda et al. | |
| 6,437,489 B1 * | 8/2002 | Shinke ................ | H01L 41/0475 310/367 |
| 2008/0310075 A1 | 12/2008 | Takeoka et al. | |

FOREIGN PATENT DOCUMENTS

| | | |
|---|---|---|
| JP | H06-291378 A | 10/1994 |
| JP | H11-26834 A | 1/1999 |

(Continued)

OTHER PUBLICATIONS

International Search Report; PCT/JP2012/078924; Dec. 11, 2012.
(Continued)

*Primary Examiner* — J. San Martin
(74) *Attorney, Agent, or Firm* — Studebaker & Brackett PC

(57) ABSTRACT

A laminate-type actuator including a laminate wherein an electrostrictive material layer is wound and laminated in a form of a tube together with first and second electrodes sandwiching the electrostrictive material layer therebetween is provided with high volume efficiency and high reliability. The tubular laminate includes a pair of flat portions facing each other and a pair of curved portions interconnecting the pair of flat portions circumferentially and specifying spaces inside the curved portions. In a cross-section perpendicular to an axis of the laminate, an outer width formed by the pair of flat portions is smaller than an outer width of each of the curved portions, and a distance between the pair of flat portions is smaller than an inner width of each of the curved portions.

5 Claims, 6 Drawing Sheets

(51) Int. Cl.
*H01L 41/27* (2013.01)
*H01L 41/083* (2006.01)
*H01L 41/33* (2013.01)
*H01L 41/193* (2006.01)

(56) References Cited

FOREIGN PATENT DOCUMENTS

| | | | |
|---|---|---|---|
| JP | 2001-160637 A | 6/2001 | |
| JP | 2007-081007 A | 3/2007 | |
| JP | 2007-114085 A | 5/2007 | |
| JP | 2008-251833 A | 10/2008 | |
| JP | 2010-273524 A | 12/2010 | |

OTHER PUBLICATIONS

Written Opinion of the International Searching Authority; PCT/JP2012/078924; Dec. 11, 2012.

* cited by examiner

LAMINATE-TYPE ACTUATOR

CROSS REFERENCE TO RELATED APPLICATIONS

This application claims benefit of priority to Japanese Patent Application No. 2011-272005 filed on Dec. 13, 2011, and to International Patent Application No. PCT/JP2012/078924 filed on Nov. 8, 2012, the entire content of which is incorporated herein by reference.

TECHNICAL FIELD

The present disclosure relates to a laminate-type actuator and a method for producing the same.

BACKGROUND

Conventionally, when a material layer which expands and contracts by application of electric voltage or electric field is used for an actuator, there is a laminate-type actuator formed by laminating such a material layer in order to obtain a larger displacement. What is known as an example of a laminate-type actuator is one obtained by providing the above-mentioned material layer with electrodes at both surfaces, and winding and laminating it in the form of a cylindrical tube (or roll) (see JP 2010-273524 A).

SUMMARY

Technical Problem

However, the conventional laminate-type actuator mentioned above has a disadvantage of small volume efficiency since an inside of the laminate in the form of a cylindrical tube is hollow. Then, in order to improve the volume efficiency of this laminate-type actuator, the present inventor has considered making the cylindrical and tubular laminate flattened.

In the field of a metallized film capacitor, it is known that a cylindrical and tubular laminate (capacitor element) of wound metallized film (dielectric film provided with metal electrodes) is flattened by being deformed into an elliptical shape (oval shape) (see JP 2007-81007 A). More specifically, the metallized film capacitor is flattened by firstly winding a metalized film around a winding core in the form of a cylindrical tube with a thin thickness to form a capacitor element and then pressing the cylindrical and tubular capacitor element thus obtained (which consists of the winding core and the metalized film) in a direction perpendicular to its axis to deform it into an elliptical shape.

However, such a configuration and producing process of a metalized film capacitor are inapplicable to a laminate-type actuator. In a case of a laminate-type actuator, since a winding core may interfere in operation (or movement) of the actuator, it is necessary to take the winding core from the laminate after the cylindrical and tubular laminate is obtained by winding around the winding core, a sheet wherein a material layer which expands and contracts by application of electric field (hereafter referred to as an "electrostrictive material layer") is provided with electrodes on both of its surfaces. Then, the cylindrical and tubular laminate thus obtained (which consists of the electrostrictive material layer and the electrodes on both of its surfaces) is pressed in a direction perpendicular to its axis to deform it into an elliptical shape, so that the laminate bends over greatly at its opposed ends. In particular, the innermost layer of the laminate bends over about 180° at its opposed ends, and thereby a crack(s) may occur in the electrode portion located on or in the vicinity of the ends. Occurrence of a crack(s) is unavoidable even if an electrode is formed of Au or Cu which shows high ductility. Then, a high electric field is applied between the electrodes to operate the actuator. Minute electric discharge will take place at a crack(s), and the electrode(s) will suffer damage. In addition, since an electrostrictive material layer expands and contracts during operation (or movement) of the actuator, a load is applied to the electrode portion located on or in the vicinity of the ends. Due to repeated operation of the actuator, such electric discharge and load extend a crack(s), so that the damage of the electrode(s) is expanded, and finally the entire electrode(s) may suffer damage.

The problems as described above is not considered as particular problems for a metalized film capacitor since the winding core is left therein and the metalized film does not expand and contract. In addition, in a case of the metalized film capacitor, there is no inhibition by expansion and contraction, and therefore the electrode thickness can be increased. However, in applying this to a laminate-type actuator, a thick electrode will inhibit expansion and contraction and cause a new problem. Therefore, only by flattening the cylindrical laminate which constitutes a laminate-type actuator, although volume efficiency improves, it is inevitable that reliability is decreased by damage to the electrode(s).

The present disclosure is directed to provide a laminate-type actuator comprising a laminate wherein an electrostrictive material layer is wound and laminated in a form of a tube together with first and second electrodes sandwiching the electrostrictive material layer therebetween, and having high volume efficiency and high reliability, and a method for producing the same.

Solution to Problem

According to one aspect of the present disclosure, there is provided a laminate-type actuator comprising a laminate wherein an electrostrictive material layer is wound and laminated in a form of a tube (or roll) together with first and second electrodes sandwiching the electrostrictive material layer therebetween, wherein the tubular laminate comprises a pair of flat portions facing each other and a pair of curved portions interconnecting the pair of flat portions circumferentially and specifying spaces inside the curved portions, and in a cross-section perpendicular to an axis of the laminate, an outer width formed by the pair of flat portions being smaller than an outer width of each of the curved portions, and a distance between the pair of flat portions being smaller than an inner width of each of the curved portions.

According to the above-described laminate-type actuator of the present disclosure, since the laminate is circumferentially (or continuously) composed of a pair of flat portions and a pair of curved portions, volume efficiency is improved in comparison to a cylindrical tubular laminate having the same perimeter as that of said laminate. Furthermore, according to the above-described laminate-type actuator of the present disclosure, spaces are present inside each of the curved portions, and in a cross-section perpendicular to an axis of the laminate, an outer width formed by the pair of flat portions is smaller than an outer width of each of the curved portions, and a distance between the pair of flat portions is smaller than an inner width of each of the curved portions, and thereby it is possible to effectively prevent crack(s) from occurring and extending in the electrode portion located on or in the vicinity of the curved portions, to reduce and preferably eliminate damage to the electrode, so that high reliability is attained.

Therefore, it becomes possible to obtain a laminate-type actuator having high volume efficiency and high reliability.

In one embodiment of the present disclosure, the first and the second electrodes may be made of an organic conductive material. According to this embodiment, a crack is difficult to be introduced into the electrode(s), and it is possible to obtain a laminate-type actuator with higher reliability.

As a certain embodiment of the present disclosure, the first electrode or the second electrode may exist as two layers between adjacent electrostrictive material layers in the laminate. According to this embodiment, high electric efficiency can be acquired in a laminate-type actuator of the present disclosure.

As another embodiment of the present disclosure, the first electrode or the second electrode may exist as one layer between adjacent electrostrictive material layers in the laminate. According to this embodiment, a laminate-type actuator of the present disclosure can be produced by a comparatively simple method.

According to another aspect of the present disclosure, there is provided a method for producing a laminate-type actuator comprising a laminate wherein an electrostrictive material layer is wound and laminated in a form of a tube together with first and second electrodes sandwiching the electrostrictive material layer therebetween, which comprises:

forming a generally cylindrical and tubular (or hollow) laminate by winding and laminating an electrostrictive material layer in a form of a generally cylindrical tube (or roll) together with first and second electrodes sandwiching the electrostrictive material therebetween;

locating a pair of columnar objects having curved side surfaces inside the generally cylindrical and tubular laminate;

subjecting the generally cylindrical and tubular laminate to at least one of external force and heat, while a distance between the pair of columnar objects is fixed or variable, to obtain a deformed tubular laminate which comprises a pair of flat portions facing each other between the pair of columnar objects and a pair of curved portions interconnecting the pair of flat portions circumferentially and formed along the curved side surfaces of the pair of columnar objects; and taking the pair of columnar objects from inside of the deformed tubular laminate.

With the method for producing a laminate-type actuator, the above-described laminate-type actuator of the present disclosure can be produced.

Advantageous Effects of Invention

According to the present disclosure, there is provided a laminate-type actuator comprising a laminate wherein an electrostrictive material layer is wound and laminated in a form of a tube together with first and second electrodes sandwiching the electrostrictive material layer therebetween, and having high volume efficiency and high reliability, and a method for producing the same.

BRIEF DESCRIPTION OF THE DRAWINGS

FIGS. 1(a) to 1(c) show schematic drawings of a laminate-type actuator in one embodiment of the present disclosure, wherein FIG. 1(a) shows a top view, FIG. 1(b) shows a cross-sectional view perpendicular to an axis, and FIG. 1(c) shows a perspective view.

FIGS. 4(a) and 4(b) show schematic drawings for explaining a method for producing the laminate-type actuator in the example of the arrangement of FIG. 2 for the embodiment of FIG. 1, wherein FIG. 4(a) shows a perspective view, and FIG. 4(b) shows a cross-sectional view along a direction of 4-4 shown in FIG. 4(a).

FIGS. 5(a) and 5(b) show schematic drawings for explaining a method for producing the laminate-type actuator in the example of the arrangement of FIG. 3 for the embodiment of FIG. 1, wherein FIG. 5(a) shows a perspective view, and FIG. 5(b) shows a cross-sectional view along a direction of 5-5 shown in FIG. 5(a).

FIGS. 6(a) and 6(b) show schematic process steps for explaining a method for producing the laminate-type actuator in the embodiment of FIG. 1, wherein FIG. 6(a) shows a perspective view of a generally cylindrical and tubular laminate, and FIG. 6(b) shows a perspective view of the laminate with a pair of columnar objects located inside the laminate.

FIGS. 7(a) through 7(c) show schematic perspective views for explaining operation of the laminate-type actuator in the embodiment of FIG. 1, wherein FIG. 7(a) shows a non-operating state, FIG. 7(b) shows an operating state in an example of displacement in a direction of X, and FIG. 7(c) shows an operating state in an example of displacement in a direction of Y.

DETAILED DESCRIPTION

A laminate-type actuator in one embodiment of the present disclosure and a method for producing it are hereafter explained in detail with reference to the drawings.

Figure 1A:
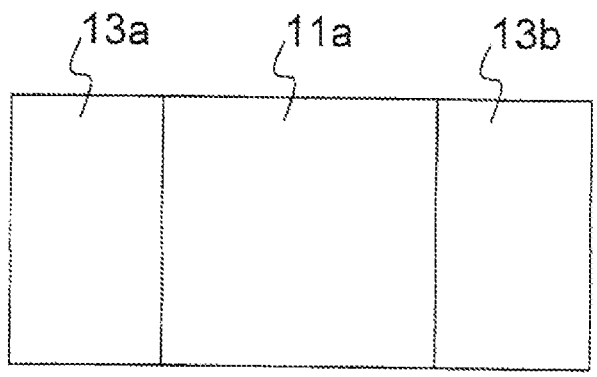
Figure 1B:
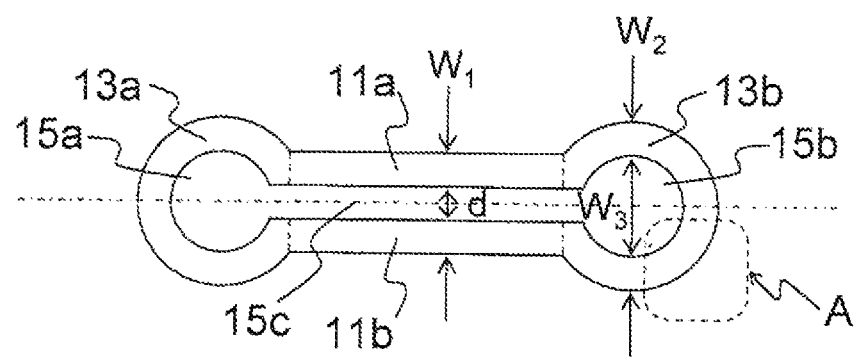
Figure 1C:
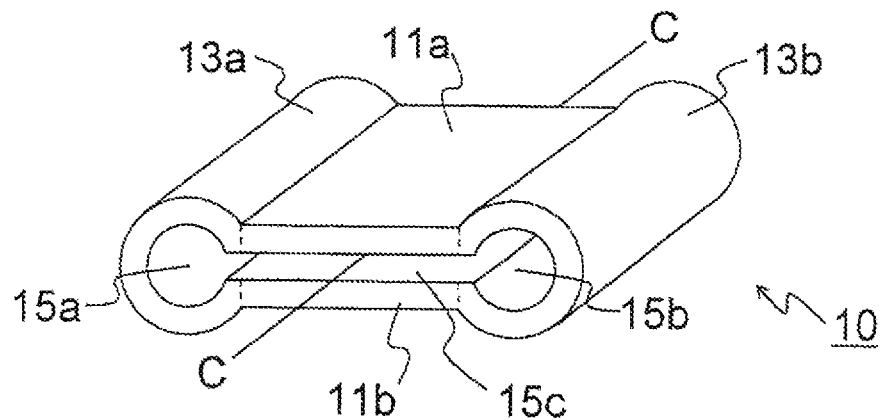

The laminate-type actuator of this embodiment contains a laminate 10 in the form of a tube having an axis C as shown in FIG. 1(c). In the present disclosure, an object in the form of a "tube" (or depicted as "tubular") means that both outer and inner surfaces of the object are circumferentially continuing, respectively. The object may have any shape in cross-section perpendicular to an axis (i.e. cross-section perpendicular to the axis of the tubular object). For example, the inside surface may have facing areas contacted with each other. The axis C is determined based on the tubular shape of the laminate 10 so that the shape in a cross-section perpendicular to the axis is symmetrical with respect to the axis as a center. If it cannot be substantially symmetrical, the axis may be determined in consideration of the center of gravity of the laminate 10.

Figure 2:
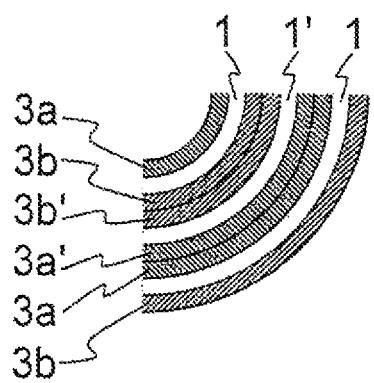
FIG. 2 shows an enlarged partial view of a region A in FIG. 1(b), which shows a schematic drawing for illustrating an example of an arrangement of an electrostrictive material layer and the first and second electrodes.
Figure 3:
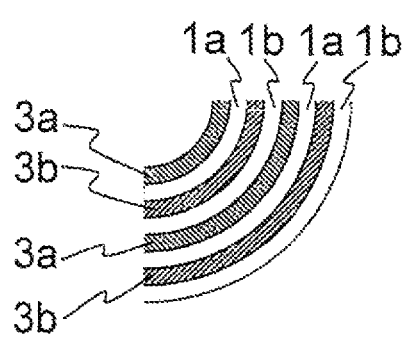
FIG. 3 shows an enlarged partial view of a region A in FIG. 1 (b), which shows a schematic drawing for illustrating another example of an arrangement of an electrostrictive material layer and the first and second electrodes.

More specifically, this laminate 10 is constituted by winding and laminating an electrostrictive material layer in the form of a tube (or roll) together with the first and second electrodes. The first and second electrodes only have to be arranged so that an electrostrictive material layer is sandwiched therebetween and that the first and second electrodes do not directly contact with each other. In one example, as shown in FIG. 2, between adjacent electrostrictive material layers 1 and 1', the first electrode 3a and 3a' may exist as two layers in total, and the second electrode 3b and 3b' may exist as two layers in total. In another example, as shown in FIG. 3, between adjacent electrostrictive material layers 1a and 1b, the first electrode 3a may exist as one layer, and the second electrode 3b may exist as one layer. These examples of an arrangement will be described below in detail in relation to the method for producing the laminate-type actuator of this embodiment. It is noted that FIG. 2 and FIG. 3 show enlarged partial views of the region A surrounded by a dotted line in FIG. 1 (b), and the number of laminated layers are shown in FIG. 2 and FIG. 3 just for illustrative purposes of this embodiment, and are not limited thereto.

The electrostrictive material layers 1, 1', 1a, and 1b are formed from an electrostrictive polymer material. An electrostrictive polymer material will not be limited particularly, as long as it is a polymer material which has a permanent dipole and shows a relative permittivity of 20 or more. Examples of the electrostrictive polymer material include terpolymers such as P(VDF-TrFE-CFE), P(VDF-TrFE-CTFE), P(VDF-TrFE-CDFE), P(VDF-TrFE-HFA), P(VDF-TrFE-HFP), P(VDF-TrFE-VC), P(VDF-TrFE-VF) (P means poly, VDF means vinylidene fluoride, TrFE means trifluoro ethylene, CFE means chloro fluoro ethylene, CTFE means chloro trifluoro ethylene, CDFE means chloro difluoro ethylene, HFA means hexafluoroacetone, HFP means hexafluoropropylene, VC means vinyl chloride, and VF means vinyl fluoride). Among them, P(VDF-TrFE-CFE) is especially preferred since it gives a large distortion. A thickness of the electrostrictive material layers 1, 1', 1a, and 1b may be suitably selected, and it may be in a range from, for example, about several micrometers to 100 μm. The electrostrictive material layers 1, 1', 1a, and 1b may differ in the electrostrictive polymer material to be used and the thickness in each example of the arrangement, but preferably are the same in these matters.

The first electrode 3a, 3a' and the second electrode 3b, 3b' may be formed from any suitable conductive material, as long as it is able to function as an electrode. As the conductive material, an organic conductive material is preferred since a crack is hard to be introduced. Examples of an organic conductive material include PEDOT (polyethylene dioxythiophene), PPy (polypyrrole), PANI (polyaniline) and the like. These may be doped with dopants of, as necessary, an organic sulfonic-acid based compound such as polyvinyl sulfonic acid, polystyrene sulfonate, polyallyl sulfonic acid, polyacrylic sulfonic acid, polymethacrylic sulfonic acid, poly-2-acrylamide-2-methylpropane sulfonic acid, polyisoprene sulfonic acid and so on. Among them, poly(3,4-ethylene dioxythiophene) doped with polystyrene sulfonate (PEDOT-PSS) is especially preferred. However, the present disclosure is not limited thereto, and it is also possible to use any other conductive materials such as a metal material, for example, Ni (nickel), Pt (platinum), Pt—Pd (platinum-palladium alloy), Al (aluminum), Au (gold), Au—Pd (gold-palladium alloy), etc. A thickness of the first electrode 3a, 3a' and the second electrode 3b, 3b' may be suitably selected according to the conductive material to be used, and it may be in a range from, for example, about 20 nm to 10 μm. The first electrode 3a, 3a' and the second electrode 3b, 3b' may differ in the conductive material to be used and the thickness in each example of the arrangement, but preferably are the same in these matters.

With reference to FIG. 1 again, the laminate 10 as described in the above has generally a pair of flat portions 11a and 11b facing each other and a pair of curved portions 13a and 13b interconnecting the pair of flat portions 11a and 11b circumferentially. The curved portions 13a and 13b include spaces 15a and 15b at their inside, respectively. In the embodiment shown in the drawings the spaces 15a and 15b are joined together with a space 15c between the pair of the flat portions 11a and 11b to form an integral hollow space, but the present disclosure is not limited thereto. For example, the pair of flat portions 11a and 11b may contact each other, and thereby the spaces 15a and 15b may be isolated.

Further, in a cross-section perpendicular to the axis of the laminate 10 (in a cross-section perpendicular to the axis C described above), an outer width $W_1$ formed by the pair of flat portions 11a and 11b is smaller than an outer width $W_2$ of each of the curved portions 13a and 13b, and a distance d between the pair of flat portions 11a and 11b is smaller than an inner width $W_3$ of each of the curved portions 13a and 13b. In other words, the dimensions satisfies $W_1<W_2$ and $d<W_3$ (where $W_1>d\geq 0$, $W_2>W_3>0$). In the present disclosure, a "width" in a cross-section perpendicular to the axis denotes a maximum size in a direction perpendicular to a longitudinal direction (shown as a dashed dotted line in FIG. 1 (b)) which corresponds to an extending direction of the pair of flat portions 11a and 11b facing each other. By satisfying $W_1<W_2$ and $d<W_3$ as described above, each of the curved portions 13a and 13b results in being curved with a curvature radius larger than the minimum, so that a crack is difficult to be generated in an electrode portion even if it is located on the innermost layer of the laminate 10, and the load applied to the curved portions during operation of the actuator can be reduced. Therefore, it becomes possible to effectively prevent a crack from occurring and extending in the electrode portion located on or in the vicinity of the curved portions 13a and 13b.

Next, the method for producing the laminate-type actuator of this embodiment is explained below.

Figure 6A:
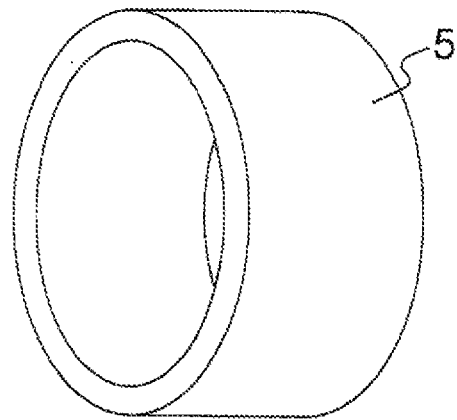
Figure 6B:
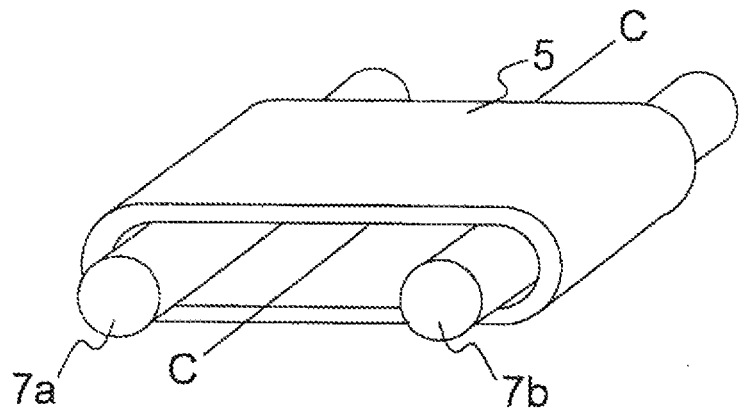

Firstly, a generally cylindrical and tubular laminate 5 (see FIG. 6 (a)) is formed by winding and laminating an electrostrictive material layer together with the first and second electrodes in a form of a generally cylindrical tube (cylindrical or substantially cylindrical tube, which is also applied hereafter), while the electrostrictive material is sandwiched (or disposed) between the first and second electrodes.

More specifically, two sheets are prepared each of which is obtained by forming at least one of the first and second electrodes on the surface of the electrostrictive material layer. Then, these two sheets overlap one another so that the first and second electrodes do not contact directly with each other to avoid short-circuit.

Figure 4A:
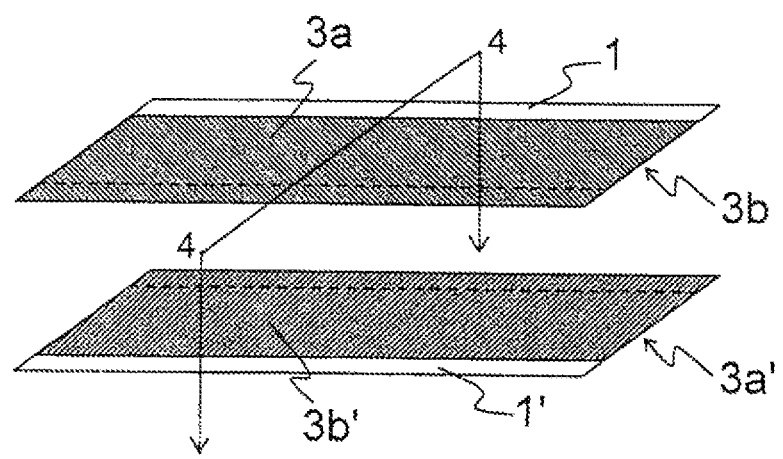
Figure 4B:
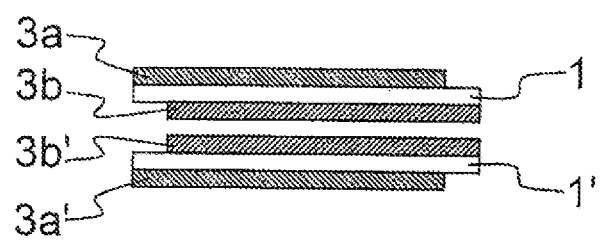

More specifically, in the case of the example of the arrangement shown in FIG. 2, the two sheets overlap one another as follows. Firstly, with reference to FIG. 4, two sheets are prepared, one of which is obtained by forming the first electrode 3a and the second electrode 3b respectively on opposite surfaces of the electrostrictive material layer 1, and the other of which is obtained by forming the first electrode 3a' and the second electrode 3b' respectively on opposite surfaces of the electrostrictive material layer 1'. These sheets may be produced simultaneously (for example, divided from one sheet). Then, these two sheets overlap one another while the first electrodes 3a and 3a' or the second electrodes 3b and 3b' are facing each other (FIG. 4 exemplarily shows the latter case). In this case, the first and second electrodes adhere sufficiently to one electrostrictive material layer from the opposed surfaces, so that high electric efficiency can be acquired.

In the case of the example of the arrangement shown in FIG. 3, the two sheets overlap one another as follows. Firstly, with reference to FIG. 5, two sheets are prepared, one of which is obtained by forming the first electrode 3a on one surface of the electrostrictive material layer 1a, and the other of which is obtained by forming the second electrode 3b on one surface of the electrostrictive material layer 1b. These sheets may be produced simultaneously (for example, divided from one sheet). Then, these two sheets overlap one another while the first electrode 3a and the second electrode 3b are disposed alternately via the electrostrictive material layers 1a and 1b. In this case, either the first or the second electrode is formed on one electrostrictive material layer, so that it can be produced with a smaller number of process steps.

Formation of the electrode(s) on an electrostrictive material layer may differ according to the material to be used. For example, when an organic conductive material as described above is used as an electrode material, a uniform electrode pattern can be formed by arranging a mask on an electrostrictive material layer, spraying a liquid containing an organic conductive material (for example, commercially available as ink, paint or the like) over the mask, optionally drying and/or heating, and then removing the mask. Otherwise, ink-jet printing, brush coating, screen printing or the like is applicable, according to the viscosity of a liquid containing an organic conductive material. However, this embodiment is not limited thereto. For example, when a metal material as described above is used as an electrode material, vapor deposition, sputtering, or the like is applicable.

Next, the overlapped two sheets as described above is wound around a generally cylindrical winding core and thereby laminated to form a generally cylindrical and tubular laminate. The winding core may be either hollow or solid, as long as it can support the sheets during winding. After forming the laminate, the winding core is taken from the laminate, and the generally cylindrical and tubular laminate 5 as shown in FIG. 6 (a) is obtained. The size and the number of laminations of the laminate may vary according to the desired purpose of the application, specification, etc. of a laminate-type actuator.

Then, as shown in FIG. 6 (b), a pair of columnar objects 7a and 7b is located inside the generally cylindrical and tubular laminate 5. At this moment, the laminate 5 may not be in the generally cylindrical and tubular shape due to its own flexibility. Each of the columnar objects 7a and 7b has a curved side surface (round columns are used in the embodiment shown in drawings) and is made of any suitable material. If a certain degree of rigidity is securable, the columnar objects 7a and 7b may be hollow. Preferably, the columnar objects 7a and 7b are located axisymmetrically inside the generally cylindrical and tubular laminate 5. More preferably, the columnar objects 7a and 7b are located at positions as close to the inside surface of the laminate 5 as possible.

Then, this laminate 5 is subjected to at least one of external force and heat to deform the laminate 5. At this time, a distance between the pair of the columnar objects 7a and 7b may be fixed or variable. External force may be applied manually or mechanically, or may be applied by vacuum suction (for example, a method of putting the laminate 5 into a pack or bag while the columnar objects 7a and 7b are located and static inside the laminate 5, vacuuming the inside of the pack or bag, and deforming the laminate 5 by air pressure from the outside) and so on. Heat is able to act on the electrostrictive material layer for forming. For example, the heat can be applied at about 100°.

Regarding the thus deformed laminate, a pair of curved portions 13a and 13b are formed along the curved side surfaces of the pair of the columnar objects 7a and 7b, and a pair of flat portions 11a and 11b are formed to face each other between the pair of the columnar objects 7a and 7b. The pair of the curved portions 13a and 13b interconnect the pair of the flat portions 11a and 11b, circumferentially.

The size of the columnar objects 7a and 7b (e.g. diameter in the case of round columns) and external force and/or heat to be used is chosen to satisfy $W_1 < W_2$ and $d < W_3$ (where $W_1 > d \geq 0$, $W_2 > W_3 > 0$). Thereby, each of the curved portions 13a and 13b results in being curved with a curvature radius larger than the minimum, and occurrence of a crack is effectively reduced. The pair of the flat portions 11a and 11b may be press-fitted by heat described above (d=0).

After that, the pair of the columnar objects 7a and 7b is taken from the inside of the deformed tubular laminate, and thereby the laminate 10 shown in FIG. 1 is obtained.

Figure 5A:
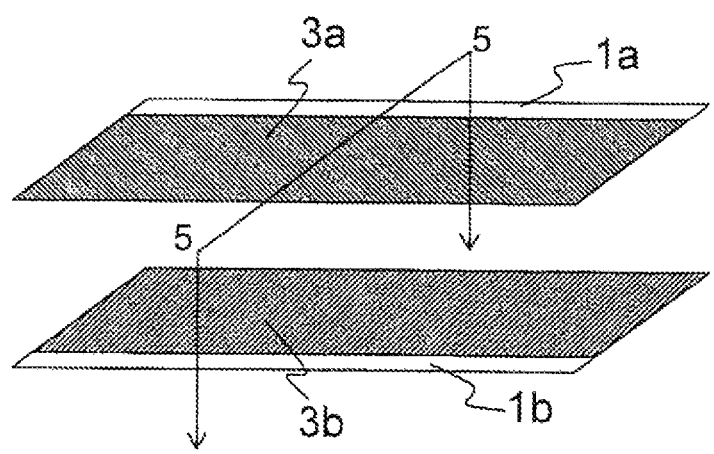
Figure 5B:
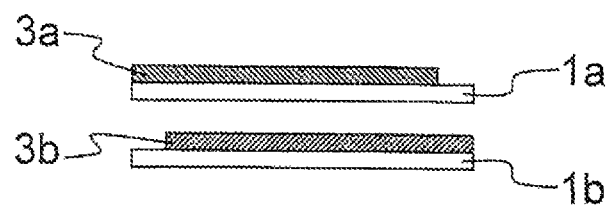

The laminate 10 obtained as described in the above is used by extracting (or wiring) the first and second electrodes from the laminate 10 separately to connect them with an electric source (not shown). For example, when the electrode patterns are formed as shown in FIG. 4 and FIG. 5, electrode extracting parts are formed on both ends of the tubular laminate 10 so that the first electrode is extracted from one end and the second electrode is extracted from the other end. However, this is not necessary to the present disclosure, the first and second electrodes may be formed in other patterns.

The laminate-type actuator of this embodiment is manufactured as described above. This laminate-type actuator can be modified to change its shape relatively freely, for example, by setting the distance between the columnar objects 7a and 7b smaller or larger during the production proses.

When an electric field is applied between the first and second electrodes, this laminate-type actuator performs displacement since the electrostrictive material layer located therebetween is distorted and thereby the laminate 10 deforms. The direction of distortion of the electrostrictive material layer with respect to the direction of the electric field may be either a perpendicular direction to the direction of the electric field, that is, an in-plane direction of the electrostrictive material layer or a parallel direction to the direction of the electric field, that is, a thickness direction of the electrostrictive material layer, or may be a combined direction of them.

Figure 7A:
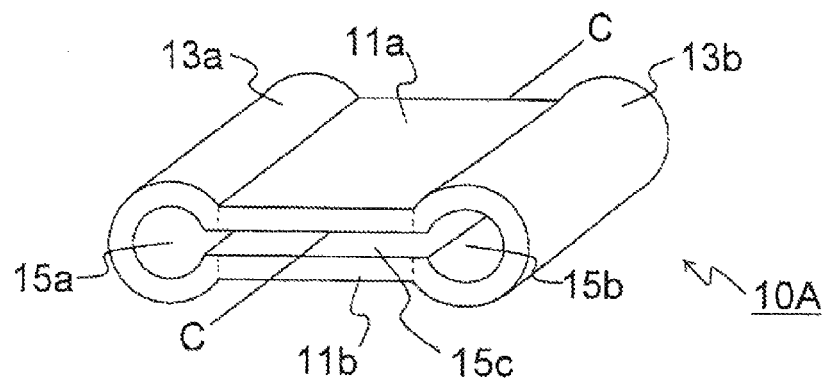
Figure 7B:
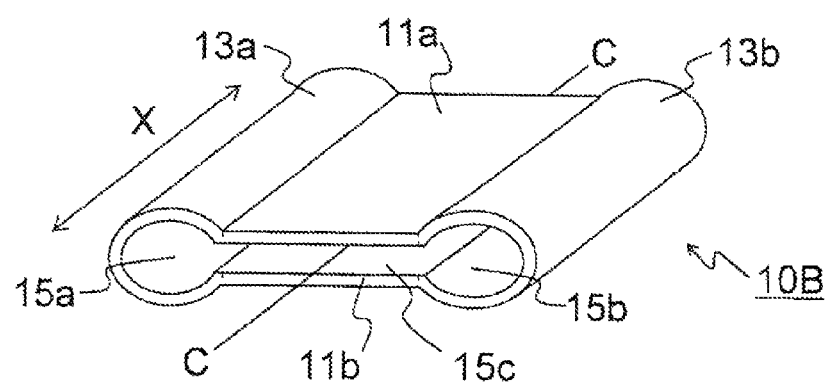
Figure 7C:
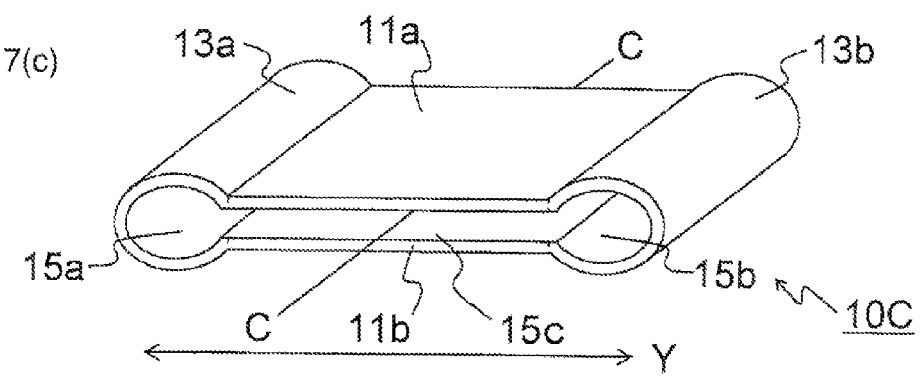

The direction of the displacement of the laminate-type actuator is selectable by giving anisotropy in a predetermined direction to the electrostrictive material layer preliminarily by extension or the like. More specifically, when an electric field is applied to a laminate-type actuator 10A (only the laminate is shown for illustrative purposes, which is also applied hereafter) in non-operating state as shown in FIG. 7 (a), possible examples of an operating state of the actuator may include one case which shows displacement in the direction of X as shown in FIG. 7 (b), and another case which shows displacement in the direction of Y as shown in FIG. 7 (c). In the example shown in FIG. 7 (b), provided that an electrostrictive material layer is preliminarily extended in a parallel direction to the axis C (the direction of X) is used to produce the laminate-type actuator 10A of FIG. 7(a). When an electric field is applied between the first and second electrodes, the electrostrictive material layer therebetween elongates in the parallel direction to the axis C (the direction of X), and thereby displacement by elongation in the direction X is obtained for the laminate-type actuator 10B as shown in FIG. 7(b). In the example shown in FIG. 7(c), provided that an electrostrictive material layer is preliminarily extended in a perpendicular direction to the axis C (the direction of Y) is used to produce the laminate-type actuator 10A of FIG. 7 (a). When an electric field is applied between the first and second electrodes, the electrostrictive material layer therebetween elongates in the perpendicular direction to the axis C (the direction of Y), and thereby displacement by elongation in the direction Y is obtained for the laminate-type actuator 10C as shown in FIG. 7(c). However, the displacement direction of the laminate-type actuator of this embodiment is not limited to these examples, but it is possible to adjust the displacement direction by changing an angle of the extension direction (inclination angle) with respect to the axis C. The examples shown in FIG. 7 (a) to (c) provide explanations related to the above-mentioned direction, but the laminate-type actuator of this embodiment is not necessarily limited thereto.

According to the laminate-type actuator of this embodiment, each of the curved portions 13*a* and 13*b* is curved with a curvature radius larger than the minimum, so that even for an electrode portion located on the innermost layer of the laminate 10, the load applied thereto during operation of the actuator can be reduced. Therefore, it becomes possible to effectively prevent a crack from occurring and extending in the electrode portion located on or in the vicinity of the curved portions 13*a* and 13*b*.

INDUSTRIAL APPLICABILITY

A laminate-type actuator of the present disclosure can be utilized broadly as soft actuators such as an artificial muscle, a micro hand, an analytical instrument and household electronic appliances in various fields such as medical care, welfare, robot industry, entertainment industry, mechatronics, chemicals, and electricity, but not limited thereto.

The invention claimed is:

1. A laminate-type actuator comprising
a laminate including an electrostrictive material layer wound and laminated in a form of a tube together with first and second electrodes sandwiching the electrostrictive material layer therebetween,
the laminate including a pair of flat portions facing each other and a pair of curved portions interconnecting the pair of flat portions circumferentially and having spaces inside the curved portions, and in a cross-section perpendicular to an axis of the laminate, an outer width formed by the pair of flat portions being smaller than an outer width of each of the curved portions, and a distance between the pair of flat portions being smaller than an inner width of each of the curved portions.

2. The laminate-type actuator according to claim 1, wherein the first and the second electrodes are made of an organic conductive material.

3. The laminate-type actuator according to claim 1, wherein the first electrode or the second electrode exists as two layers between adjacent electrostrictive material layers in the laminate.

4. The laminate-type actuator according to claim 1, wherein the first electrode or the second electrode exists as one layer between adjacent electrostrictive material layers in the laminate.

5. A method for producing the laminate-type actuator according to claim 1, the method comprising the steps of:
forming a generally cylindrical and tubular laminate by winding and laminating an electrostrictive material layer in a form of a generally cylindrical tube together with first and second electrodes sandwiching the electrostrictive material therebetween;
locating a pair of columnar objects having curved side surfaces inside the generally cylindrical and tubular laminate;
subjecting the generally cylindrical and tubular laminate to at least one of external force and heat to obtain a deformed tubular laminate which comprises a pair of flat portions facing each other between the pair of columnar objects and a pair of curved portions interconnecting the pair of flat portions circumferentially and formed along the curved side surfaces of the pair of columnar objects; and
taking the pair of columnar objects from inside of the deformed tubular laminate.

* * * * *